United States Patent [19]

Ueki et al.

[11] Patent Number: 5,021,788
[45] Date of Patent: Jun. 4, 1991

[54] DIGITAL ANALOG CONVERTER

[75] Inventors: Massaaki Ueki; Toshihiko Masuda, both of Tokyo; Takashi Kanai, Chiba, all of Japan

[73] Assignee: Sony Corporation, Tokyo, Japan

[21] Appl. No.: 479,163

[22] Filed: Feb. 13, 1990

[30] Foreign Application Priority Data

Feb. 14, 1989 [JP] Japan .................................. 1-34570

[51] Int. Cl.$^5$ ......................................... H03M 1/82
[52] U.S. Cl. ..................................... 341/152; 341/144
[58] Field of Search ................... 341/152, 144, 53, 93, 341/106; 375/22

[56] References Cited

U.S. PATENT DOCUMENTS

| 3,912,863 | 10/1975 | Patience | 341/53 X |
| 4,467,319 | 8/1984 | Uchikoshi | 341/152 |
| 4,542,371 | 9/1985 | Uchikoshi | 341/152 |
| 4,780,656 | 10/1988 | Mitchell | 318/798 |
| 4,929,947 | 5/1990 | Toyama | 341/152 |

FOREIGN PATENT DOCUMENTS 1-58125  3/1989  Japan .................................. 341/152

OTHER PUBLICATIONS

The Engineering Staff of Analog Devices, Inc. Analog-Digital Conversion Handbook, 1986, pp. 186-188.

*Primary Examiner*—J. R. Scott
*Assistant Examiner*—H. L. Williams
*Attorney, Agent, or Firm*—Alvin Sinderbrand; William S. Frommer

[57] ABSTRACT

A PWM digital-to-analog converter is disclosed in which a value representing a differential between a first pulse width modulated waveform based upon input digital data and a second pulse width modulated waveform representing a 2's complement version of the input digital data is produced by a differential amplifier and high frequency components thereof are attenuated to produce an analog output signal and with an improved distortion factor.

5 Claims, 5 Drawing Sheets

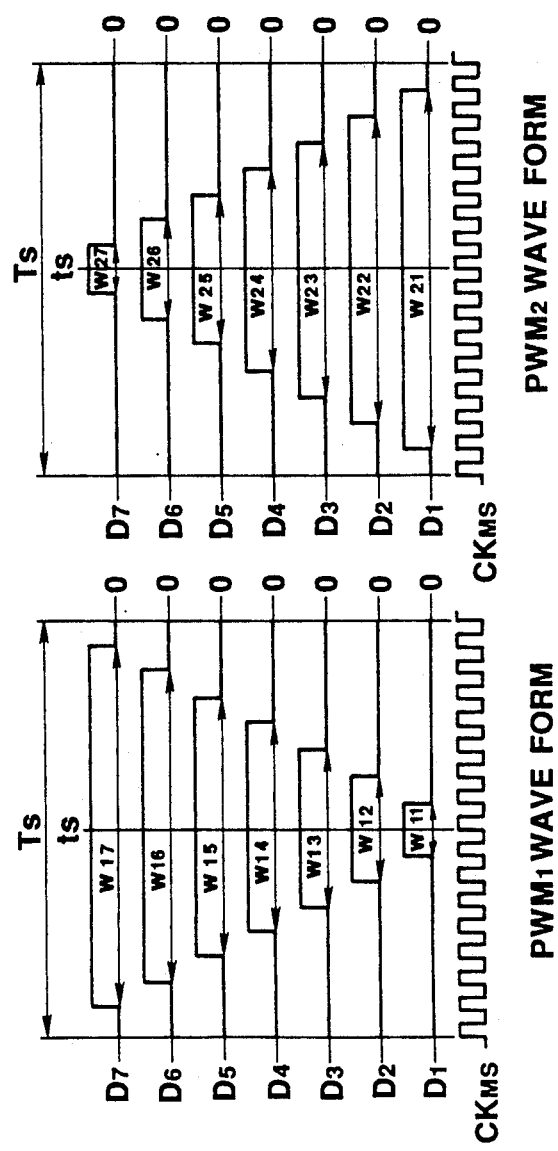
FIG. 4 PWM1 WAVE FORM
FIG. 5 PWM2 WAVE FORM
FIG. 6 PWM0 WAVE FORM

DIGITAL ANALOG CONVERTER

BACKGROUND OF THE INVENTION

1. Field of the Invention

This invention relates to a pulse width modulation digital-to-analog converter for converting input digital data into a pulse width modulated waveform for conversion into corresponding analog signals.

2. Prior Art

Various types of digital-to-analog converters are known in the art for converting input digital signals into corresponding analog signals, such as a pulse width modulation or PWM system for converting input digital data into a pulse width modulated waveform, or a pulse amplitude modulation or PAM system for converting input digital data into a pulse amplitude modulated waveform, for conversion into corresponding analog signals.

On the other hand, in digital audio signal processing systems, such as CD or DAT, several techniques have been proposed for reducing quantization noise at the time of decoding analog audio signals from digital data. These include an oversampling technique for converting digital data with a sampling frequency fs according to Nyquist's theorem into data having a sampling frequency which is a multiple (n·fs) thereof, and a noise shaping technique which changes the frequency distribution characteristics of the noise for improving the S/N ratio. For example, as disclosed in the Japanese Patent Publication 61-177819 (1986), digital data which have been subjected to oversampling or noise-shaping, as mentioned above, are converted into analog form by a digital-to-analog converter producing analog audio signals having a reduced quantization noise level.

Meanwhile, although it is possible in principle with the above mentioned PAM digital to analog converter to produce analog output signals with excellent linearity and reduced distortion, it has the drawback that high accuracy resistance summation or current summation circuits, accurately registered with the weights of the input digital data bits, are required. If it is desired to improve resolution, the circuit scale must be increased and the circuit as a whole must be designed to provide high accuracy.

On the other hand, the above mentioned PWM digital-to-analog converters have a less complex circuit organization. In a conventional PWM digital-to-analog converter, as shown in FIG. 1, pulse width modulated waveforms having pulse widths $W_7$, $W_6$, $W_5$, $W_4$, $W_3$, $W_2$ and $W_1$, corresponding with 3-bit 7-value input digital data $D_7$, $D_6$, $D_5$, $D_4$, $D_3$, $D_2$ and $D_1$ are generated and freed of high frequency components in a low-pass filter to produce analog output signals. However, as shown in the spectral distribution diagram of FIG. 2, which illustrates the results of an FFT analysis of a pulse width modulated waveform generated with the use of the conventional circuit from a 10kHz sinusoidal signal, the even-number order distortion components, and above all, the second order distortion components HD, are large.

OBJECTS AND SUMMARY OF THE INVENTION

It is therefore an object of the present invention to provide a PWM digital-to-analog converter in which the even-number order distortion components are reduced.

It is another object of the present invention to provide a digital-to-analog converter having a simplified circuit organization, which has a low distortion factor and excellent conversion characteristics.

It is a further object of the present invention to provide an arrangement in which a decoded output signal with reduced distortion may be produced by a decoding section of a digital audio signal processing system.

In accordance with the present invention, a digital-to-analog converter comprises first pulse width modulated waveform generating means for generating a first pulse width modulated waveform based upon input digital data, second pulse width modulated waveform generating means for generating a second pulse width modulated waveform representing a 2's complement version of said input digital data, differential amplifying means for producing a differential output waveform based upon said first and second pulse width modulated waveforms generated by said first and second pulse width modulated waveform generating means, and filter means for attenuating high frequency components of said differential output waveform obtained from said differential amplifying means to produce an analog output signal.

Thus, in the digital-to-analog converter according to the present invention, a value representing a differential between the pulse width modulated waveform generated by the first pulse width modulated waveform generating means based upon input digital data and the pulse width modulated waveform representing a 2's complement version of the input digital data and generated by the second pulse width modulated waveform generating means, is output by the differential amplifying means, and high frequency components of the differential output waveform thus produced are attenuated by filter means to produce analog output signals. In this manner, the even-number order distortion components are reduced to improve the distortion factor.

The above and other objects and novel features of the present invention will become apparent from the following description and the appended claims.

BRIEF DESCRIPTION OF THE DRAWINGS

FIG. 4 is a waveform diagram showing pulse width modulated waveforms produced by a first pulse width modulated waveform generator of the digital-to-analog converter shown in FIG. 3.

FIG. 5 is a waveform diagram showing pulse width modulated waveforms produced by a second pulse width modulated waveform generator of the digital-to-analog converter shown in FIG. 3.

FIG. 6 is a waveform diagram showing differential output waveforms produced by a differential amplifier of the digital-to-analog converter shown in FIG. 3.

DETAILED DESCRIPTION OF A PREFERRED EMBODIMENT

A preferred embodiment of a digital-to-analog converter in accordance with the present invention is explained herein in detail with reference to the accompanying drawings.

Figure 1:
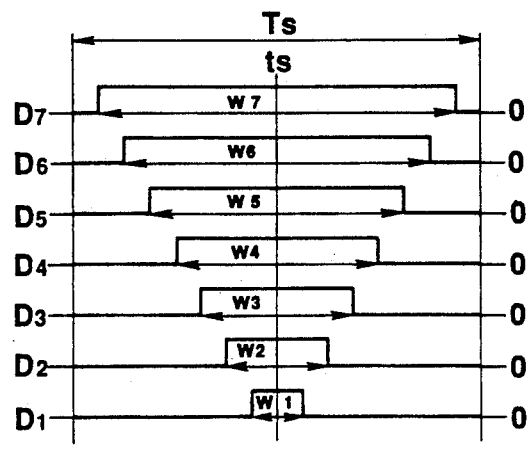
FIG. 1 is a waveform diagram showing a PWM waveform produced in a conventional PWM digital-to-analog converter.
Figure 2:
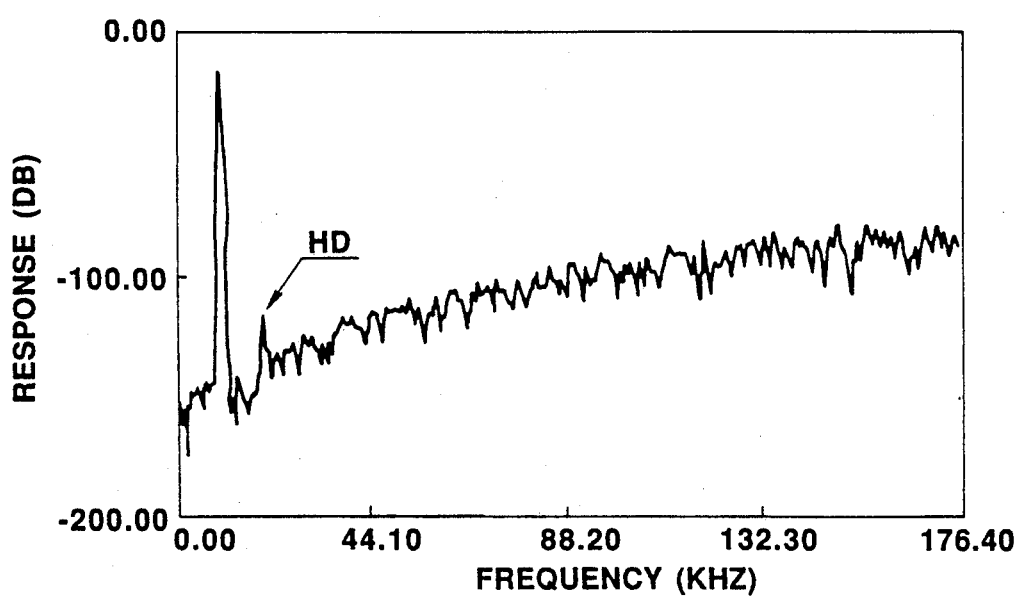
FIG. 2 is a spectrum distribution showing the results of an FFT analysis of the PWM waveform shown in FIG. 1.
Figure 3:
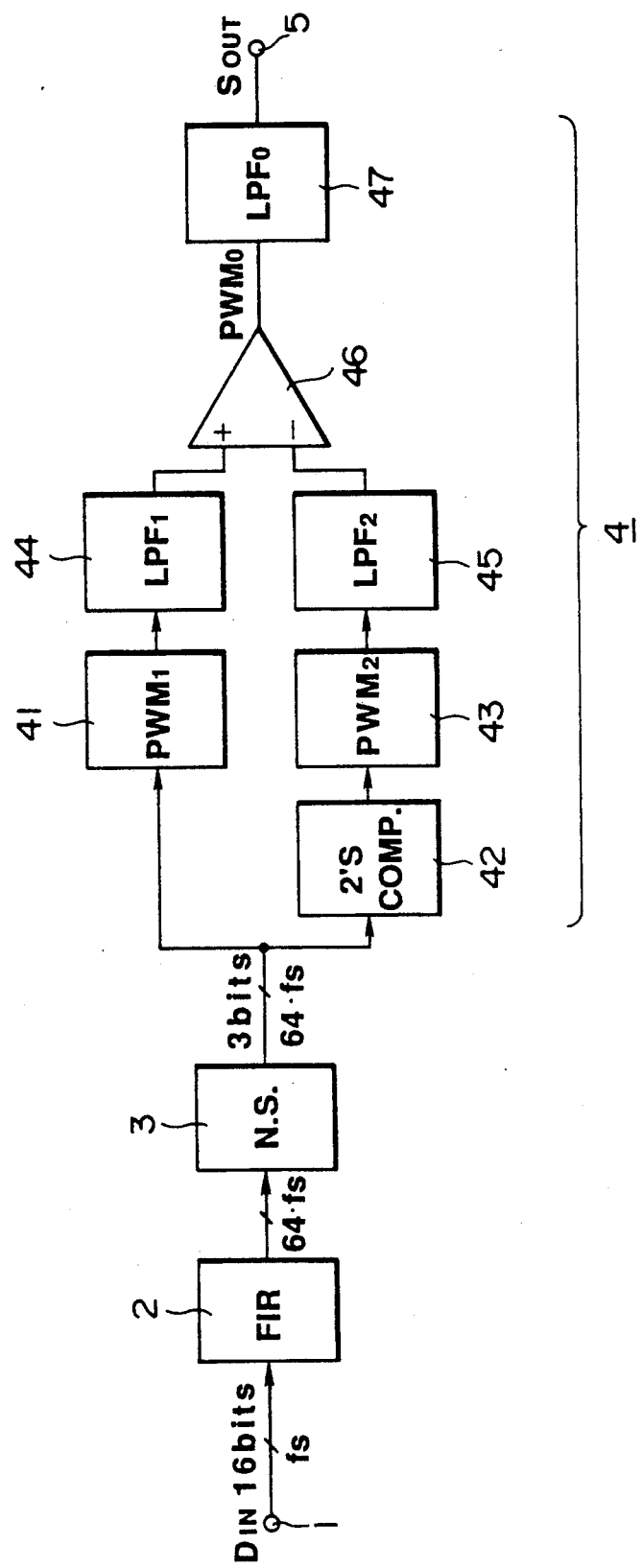
FIG. 3 is a block diagram of a digital data decoding system including an embodiment of a digital-to-analog converter according to the present invention.

FIG. 3 illustrates an embodiment of the present invention incorporated in a decoding system of a digital audio signal processing system wherein 16-bit playback digital audio data $D_{IN}$ are supplied via an input terminal 1 to an oversampling section 2.

The oversampling section 2 converts the playback digital audio data $D_{IN}$ into digital data having a frequency 64·fs, which is 64 times the sampling frequency fs, and transmits the oversampled digital data to a noise shaping section 3.

The noise shaping section 3 performs noise shaping on the oversampled 16-bit digital data from the oversampling section 2 for rounding it to 3-bit 7-value digital data for removing the quantization error, and transmits the noise shaped 3-bit 7-value digital data to a digital-to-analog converter 4 of the present invention.

The digital-to-analog converter 4 includes a first pulse width modulated waveform generator 41 for generating a pulse width modulated waveform $PWM_1$ corresponding to the noise-shaped 3-bit 7-valued input digital data from the noise shaping section 3, a 2's complement converter 42 for converting the input digital data into 2's complement data, and a second pulse width modulated waveform generator 43 for generating a pulse width modulated waveform $PWM_2$. Converter 4 further includes a differential amplifier 46 to the input of which pulse width modulated waveform outputs from the first and second pulse width modulated waveform generators 41, 43 are supplied via low-pass filters 44, 45 respectively, and a low-pass filter 47 for eliminating high frequency components of the differential output waveform from the differential amplifier 46.

With reference also to FIG. 4, first pulse width modulated waveform generator 41 receives 3-bit 7-value input digital data from the noise shaping section 3, and generates, in synchronism with a master clock $CK_{MS}$, a pulse width modulated waveform $PWM_1$, having pulse widths $W_{17}$, $W_{16}$, $W_{15}$, $W_{14}$, $W_{13}$, $W_{12}$ and $W_{11}$, which correspond with respective values of the input digital data (as shown in FIG. 4) and which are symmetrical with respect to a central point ts of one sampling period Ts.

Referring now to FIG. 5, the second pulse width modulated waveform generator 43 generates, in synchronism with the master clock $CK_{MS}$, a pulse width modulated waveform $PWM_2$ having pulse widths $W_{27}$, $W_{26}$, $W_{25}$, $W_{24}$, $W_{23}$, $W_{22}$ and $W_{21}$ which correspond with respective 2's complement values of the input digital data $D_7$, $D_6$, $D_5$, $D_4$, $D_3$, $D_2$ and $D_1$ from the 2's complement converter 42 (as shown in FIG. 5) and which are symmetrical with respect to the central point ts of one sampling period Ts.

Thus the first and second pulse width modulating waveform generators 41, 43 receive the input digital data $D_7$, $D_6$, $D_5$, $D_4$, $D_3$, $D_2$ and $D_1$, and generate, in synchronism with the master clock $CK_{MS}$, pulse width modulated waveforms $PWM_1$, $PWM_2$ having pulse widths defined by $W_{17}=W_{21}$, $W_{16}=W_{22}$, $W_{15}=W_{23}$, $W_{14}=W_{24}$, $W_{13}=W_{25}$, $W_{12}=W_{26}$ and $W_{11}=W_{27}$ and symmetrical with respect to the central point ts of one sampling period Ts.

The pulse width modulated waveform outputs $PWM_1$, $PWM_2$ from the first and second pulse width modulated waveform generators 41, 43 are supplied via low-pass filters 44, 45 to respective inputs of the differential amplifier 46, from which a differential output $PWM_0$ based on the input digital data $D_7$, $D_6$, $D_5$, $D_4$, $D_3$, $D_2$ and $D_1$ as shown in FIG. 6 is produced as a differential output of the pulse width modulated waveform $PWM_1$, $PWM_2$.

The low-pass filters 44, 45 function to limit the slope of the rising and falling edges of the pulse width modulated waveform outputs $PWM_1$, $PWM_2$ from the first and second pulse width modulated waveform generators 41, 43 to a slope which is consistent with the response speed of the differential amplifier 46. These low-pass filters 44, 45 may be omitted in principle if a differential amplifier having ideal operating characteristics is employed as the amplifier 46.

The digital-to-analog converter 4 eliminates the high frequency components of the differential output waveform $PWM_0$ from the differential amplifier 46, by means of the low-pass filter 47 to output an analog output signal $S_{OUT}$, consistent with the input digital data $D_7$, $D_6$, $D_5$, $D_4$, $D_3$, $D_2$ and $D_1$ that is, the 16-bit playback digital audio data $D_{IN}$ supplied to the input terminal 1, at signal output terminal 5.

Figure 7:
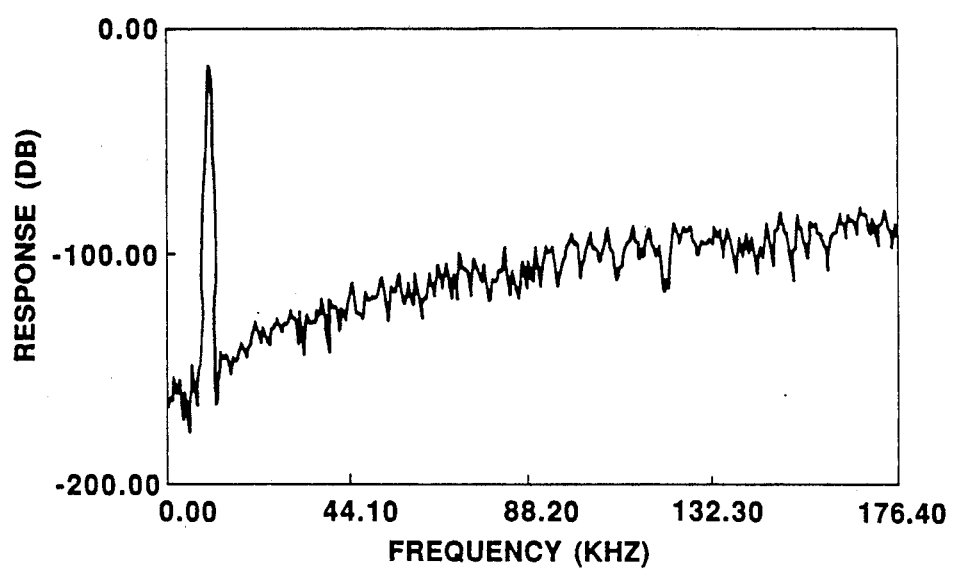
FIG. 7 is a spectrum distribution showing the results of an FFT analysis of a differential output waveform of the differential amplifier shown in FIG. 6.

The spectrum distribution diagram of FIG. 7 illustrates the results of an FFT analysis of a differential output waveform $PWM_0$ obtained by the differential amplifier 45 from 10kHz sinusoidal digital data. It will be seen from the diagram of FIG. 7 that waveform distortion of even number order, especially of the second order, may be reduced for realizing a digital-to-analog converter having a simplified structure which possesses a low distortion factor and provides superior conversion characteristics.

Figure 8:
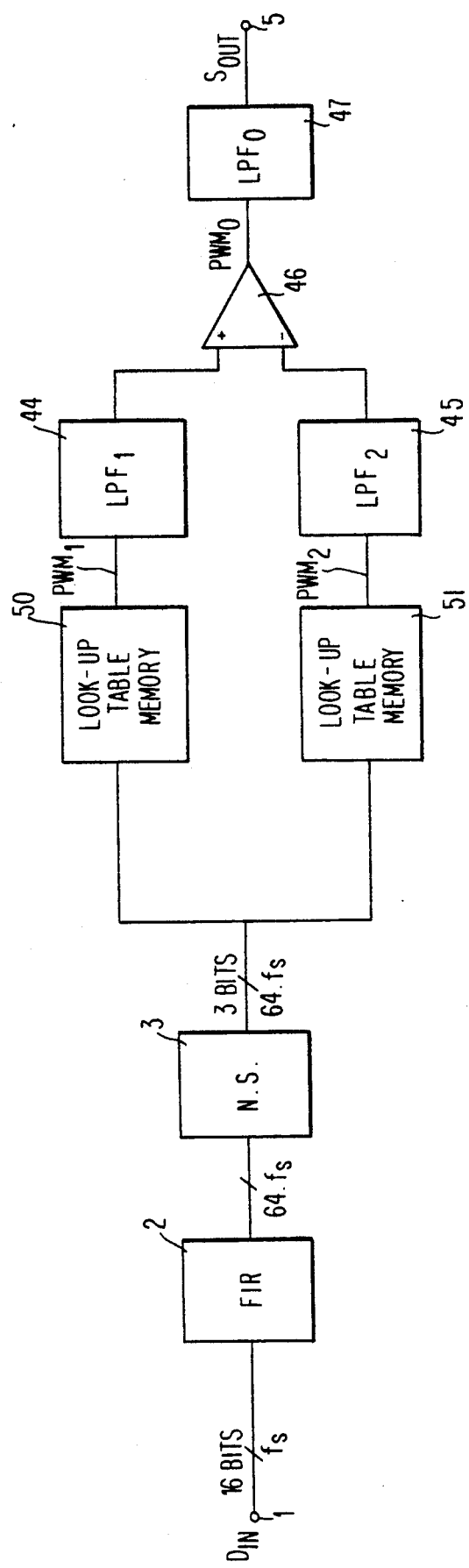
FIG. 8 is a block diagram of a digital data decoding system including a further embodiment of a digital-to-analog converter according to the present invention.

In the digital-to-analog converter 4 of the present illustrative embodiment, the input digital data are supplied via the 2's complement circuit 42 to the second pulse width modulated waveform generator 43. However, in the alternative, and with reference to FIG. 8, each of the first and second pulse width modulated waveform generators 41, 43 may be constituted by a look-up table memory (designated 50 and 51, respectively, in FIG. 8) in which pulse width modulated waveform data $PWM_1$, $PWM_2$ of the various pulse widths to be generated, are stored at addresses corresponding to the input digital data $D_7$, $D_6$, $D_5$, $D_4$, $D_3$, $D_2$ and $D_1$, as shown in Table 1. In this manner, the pulse width modulated waveforms $PWM_1$, $PWM_2$ may be directly formed from the input digital data $D_7$, $D_6$, $D_5$, $D_4$, $D_3$, $D_2$ and $D_1$ by the first and second pulse width modulated waveform generators 41, 43, without the use of a 2's complement circuit.

TABLE 1

| ADDRESS | Pulse width modulation output | |
|---|---|---|
| | $PWM_1$ | $PWM_2$ |
| $D_7$ | $W_{17}$ | $W_{21}$ |
| $D_6$ | $W_{16}$ | $W_{22}$ |
| $D_5$ | $W_{15}$ | $W_{23}$ |
| $D_4$ | $W_{14}$ | $W_{24}$ |
| $D_3$ | $W_{13}$ | $W_{25}$ |
| $D_2$ | $W_{12}$ | $W_{26}$ |

TABLE 1-continued

| ADDRESS | Pulse width modulation output | |
|---|---|---|
| | PWM$_1$ | PWM$_2$ |
| D$_1$ | W$_{11}$ | W$_{27}$ |

What is claimed is:

1. A digital-to-analog converter comprising:
   input means for supplying input digital data,
   first waveform generating means coupled with the input means to receive said input digital data for generating a first pulse width modulated waveform corresponding with said input digital data,
   second waveform generating means coupled with the input means to receive said input digital data for generating a second pulse width modulated waveform corresponding with a 2's complement version of said input digital data,
   first low pass filter means for attenuating high frequency components of said first waveform to produce a first filtered waveform,
   second low pass filter means for attenuating high frequency components of said second waveform to produce a second filtered waveform,
   differential amplifying means coupled with the first low pass filter means to receive the first filtered waveform therefrom and with the second low pass filter means to receive the second filtered waveform therefrom, for producing a differential output waveform based upon said first filtered waveform and said second filtered waveform, and
   filter means for attenuating high frequency components of said differential output waveform obtained from said differential amplifying means to produce an analog output signal.

2. The digital-to-analog converter according to claim 1, wherein said second waveform generating means comprises 2's complement converting means for converting said input digital data into a 2's complement data format of said input digital data and pulse width modulated waveform generating means for generating a pulse width modulated waveform based upon said 2's complement data format of said input digital data.

3. The digital-to-analog converter according to claim 1, wherein said input means is operative to receive reproduced digital data, said input means comprising:
   oversampling means for subjecting said reproduced digital data to an oversampling operation to produce oversampled data, and
   noise shaping means for eliminating quantization errors in said oversampled data from said oversampling means, and further wherein,
   the first and second waveform generating means are coupled with said noise shaping means to receive the oversampled data from which quantization errors have been eliminated as said input digital data.

4. A digital-to-analog converter comprising:
   input means for supplying input digital data,
   waveform generating means coupled with the input means to receive said input digital data for generating a first pulse width modulated waveform corresponding with said input digital data,
   lookup table memory means having an address input coupled with said input means to receive said input digital data for outputting stored values each in the form of a pulse width modulated waveform corresponding with a 2's complement of said input digital data received at the address input thereof,
   differential amplifying means for producing a differential output waveform based upon said first waveform produced by said waveform generating means and said stored values output by said lookup table memory means, and
   filter means for attenuating high frequency components of said differential output waveform obtained from said differential amplifying means to produce an analog output signal.

5. The digital-to-analog converter according to claim 4, wherein said waveform generating means comprises a further lookup table memory means having an address input coupled with said input means to receive said input digital data for outputting as said first waveform stored values each in the form of a pulse width modulated waveform corresponding with said input digital data.

* * * * *